US009776866B2

(12) United States Patent
Kageyama et al.

(10) Patent No.: US 9,776,866 B2
(45) Date of Patent: Oct. 3, 2017

(54) METHOD FOR PRODUCING PEROVSKITE METAL OXYNITRIDE

(71) Applicant: Japan Science and Technology Agency, Kawaguchi-shi, Saitama (JP)

(72) Inventors: Hiroshi Kageyama, Kyoto (JP); Yoji Kobayashi, Kyoto (JP); Kohei Aizu, Kyoto (JP); Wataru Yoshimune, Kyoto (JP); Hideo Hosono, Tokyo (JP)

(73) Assignee: Japan Science and Technology Agency, Saitama (JP)

( * ) Notice: Subject to any disclaimer, the term of this patent is extended or adjusted under 35 U.S.C. 154(b) by 0 days.

(21) Appl. No.: 15/125,469

(22) PCT Filed: Jan. 9, 2015

(86) PCT No.: PCT/JP2015/050543
§ 371 (c)(1),
(2) Date: Sep. 12, 2016

(87) PCT Pub. No.: WO2015/136953
PCT Pub. Date: Sep. 17, 2015

(65) Prior Publication Data
US 2017/0073229 A1    Mar. 16, 2017

(30) Foreign Application Priority Data

Mar. 13, 2014 (JP) ................. 2014-050740

(51) Int. Cl.
*C01B 21/08* (2006.01)
*C30B 1/10* (2006.01)
(Continued)

(52) U.S. Cl.
CPC ........ *C01B 21/0821* (2013.01); *C01G 23/006* (2013.01); *C30B 1/10* (2013.01);
(Continued)

(58) Field of Classification Search
CPC ..... C01B 21/0821; C01G 23/006; C30B 1/10; C30B 29/38; C01P 2002/34–2002/77
See application file for complete search history.

(56) References Cited

U.S. PATENT DOCUMENTS 4,734,390 A    3/1988   Marchand et al.
4,964,016 A    10/1990  Marchand et al.
(Continued)

FOREIGN PATENT DOCUMENTS

JP    61-122108    6/1986
JP    63-252920    10/1988
(Continued)

OTHER PUBLICATIONS

Fuertes, S. "Chemistry and application of oxynitrideperovskites." J. Mater. Chem. 22, 3293-3299, (2012).
(Continued)

*Primary Examiner* — Colleen Dunn
(74) *Attorney, Agent, or Firm* — Hamre, Schumann, Mueller & Larson, P.C.

(57) ABSTRACT

The method for producing a perovskite metal oxynitride of the present invention, comprises: a hydrogenation step (A) of forming a perovskite oxyhydride in which an oxide ion (O2−) and a hydride ion (H−) coexist, by reducing a perovskite oxide through a reductive oxygen elimination reaction using a metal hydride; and a nitriding step (B) of forming a perovskite oxynitride containing a nitride ion (N3−) by heat-treating the perovskite oxyhydride in the presence of a nitrogen source substance at a temperature of 300° C. or higher and 600° C. or lower and exchanging the hydride ion (H−) for a nitride ion (N3−).

6 Claims, 6 Drawing Sheets

(51) Int. Cl.
  *C30B 29/38* (2006.01)
  *C01B 21/082* (2006.01)
  *C01G 23/00* (2006.01)
(52) U.S. Cl.
  CPC .......... *C30B 29/38* (2013.01); *C01P 2002/34* (2013.01); *C01P 2002/72* (2013.01); *C01P 2002/77* (2013.01)

(56) References Cited

U.S. PATENT DOCUMENTS

| | | | | |
|---|---|---|---|---|
| 5,693,102 | A * | 12/1997 | Jansen | C01B 21/0821 106/401 |
| 5,745,336 | A * | 4/1998 | Saito | H01G 7/06 257/306 |
| 5,766,336 | A * | 6/1998 | Jansen | C01B 21/0821 106/401 |
| 5,980,977 | A * | 11/1999 | Deng | H01G 9/0032 427/376.2 |
| 6,379,449 | B1 * | 4/2002 | Jansen | C01B 21/0602 106/401 |
| 6,383,416 | B1 | 5/2002 | Hamada et al. | |
| 6,432,325 | B1 * | 8/2002 | Hamada | H01J 1/142 252/518.1 |
| 6,878,666 | B2 * | 4/2005 | Domen | B01J 23/02 501/96.1 |
| 7,931,821 | B2 * | 4/2011 | Saito | C01B 21/0821 252/62.9 PZ |
| 8,287,831 | B2 * | 10/2012 | Cohen | C01B 21/082 252/62.9 R |
| 8,721,915 | B2 * | 5/2014 | Cohen | C01B 21/082 117/944 |
| 8,848,336 | B2 * | 9/2014 | Koutsaroff | C01G 23/006 361/306.1 |
| 8,981,626 | B2 * | 3/2015 | Miura | H01L 41/187 252/62.9 PZ |
| 2010/0155647 | A1 | 6/2010 | Saito et al. | |
| 2013/0154443 | A1 | 6/2013 | Miura et al. | |
| 2014/0128252 | A1 | 5/2014 | Hosono et al. | |

FOREIGN PATENT DOCUMENTS

| | | |
|---|---|---|
| JP | 3078287 B | 8/2000 |
| JP | 2010-143788 | 7/2010 |
| JP | 2013-128073 | 6/2013 |
| JP | 2013-256434 * | 12/2013 |
| WO | 2013/008705 | 1/2013 |

OTHER PUBLICATIONS

A. Hellwig et al., "Formation of barium-tantalum oxynitrides" J. Mater. Sci. 29, 4686-4693 (1994).

S. Balaz et al. "Electronic Structure of Tantalum OxynitridePerovskite Photocatalysts" Chemistry of Materials 25(16), pp. 3337-3343(2013).

Brauniger, T., Muller, T., Pampel, A., and Abicht, "Study of Oxygen-Nitrogen Replacement in BaTiO3 by 14N Solid-State Nuclear Magnetic Resonance." Chem.Mater.17, 4114-4117, H.P.(2005).

M.A. Hayward et al., "The Hydride Anion in an Extended Transition Metal Oxide Array; LaSrCoO3H0.7" Science, 295, 1882-1884(2002).

R.M. Helps et al., "Sr3Co2O4.33H0.84; An Extended Transition Metal Oxide-Hydride" Inorganic Chemistry, 49, 11062-11068(2010).

Y. kobayashi et al., "An oxyhydride of BaTiO3 exhibiting hydride exchange and electronic conductivity" Nat.Mater., 11, 507-511(2012).

T. Sakaguchi et al., "Oxyhydrides of (Ca, Sr, Ba)TiO3 PerovskiteSolid Solutions" Inorg.Chem., 51(21), 11371-11376 (2012).

Takeshi Yajima et al., "Perovskite Oxyhydride", Journal of the Crystallographic Society of Japan, vol. 55, No. 4, pp. 242-247 (2013)—English abstract.

International Search Report issued for International Application No. PCT/JP20151050543, 6 pages, dated Apr. 21, 2016.

The 52nd Symposium on Basic Science of Ceramics, Abstract Book, Nagoya 2014, published on Jan. 9, 2014—English abstract.

* cited by examiner

[Fig. 1]
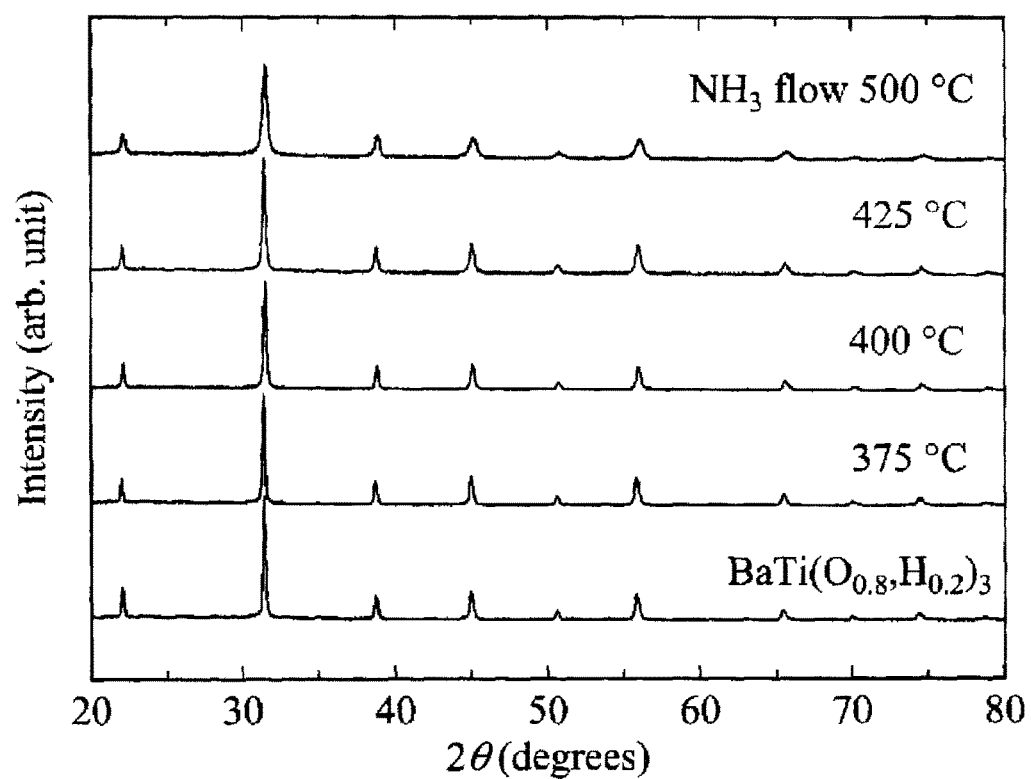

[Fig. 2]

[Fig. 3]
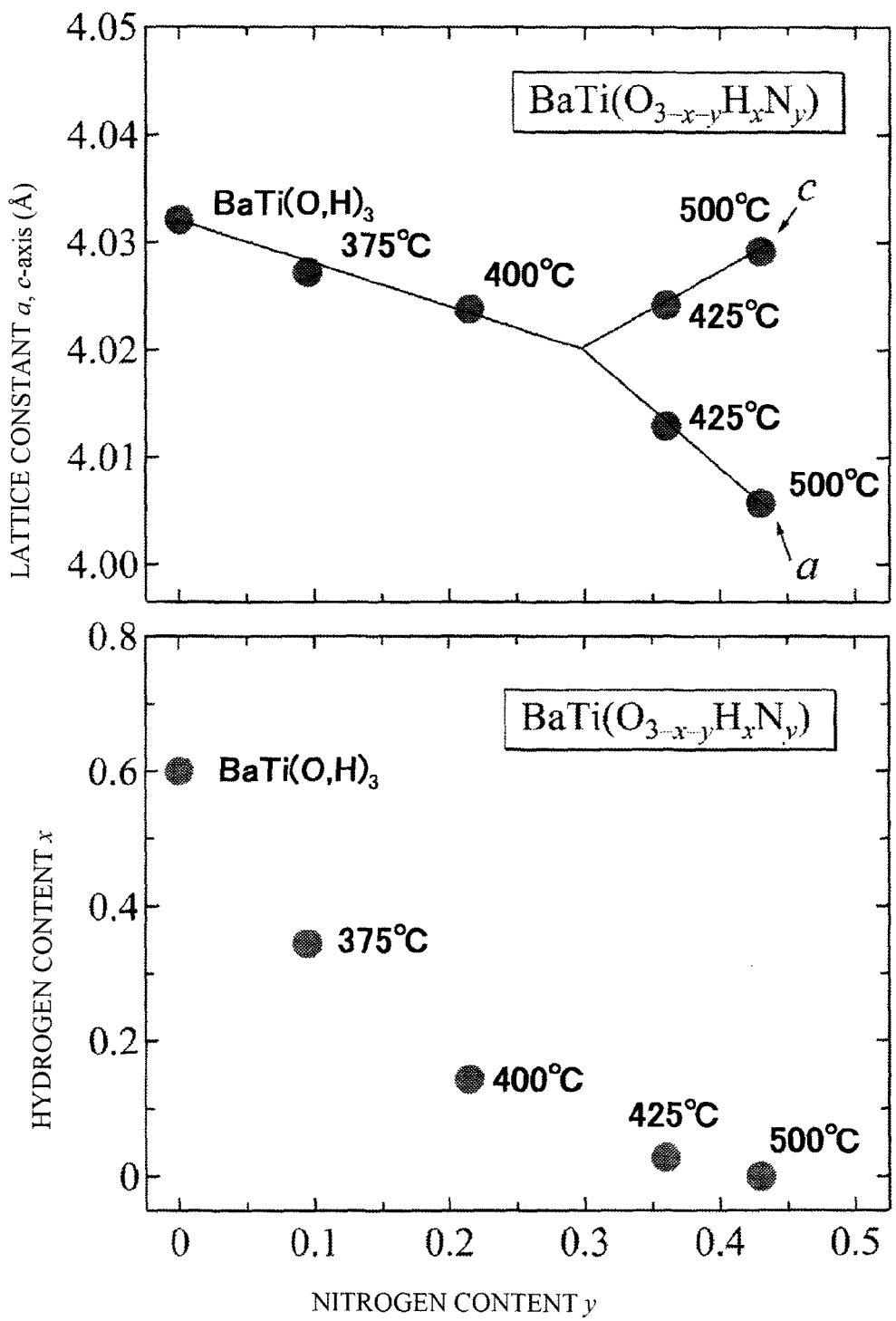

[Fig. 4]
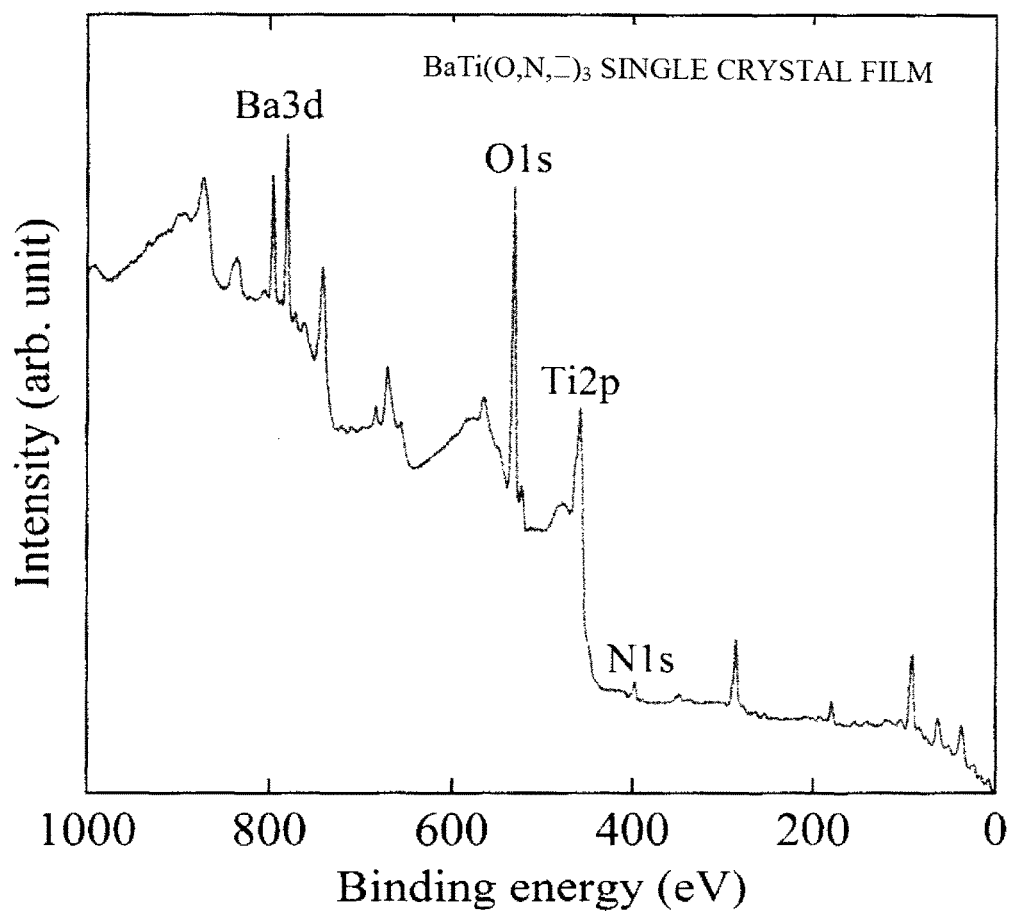

[Fig. 5]
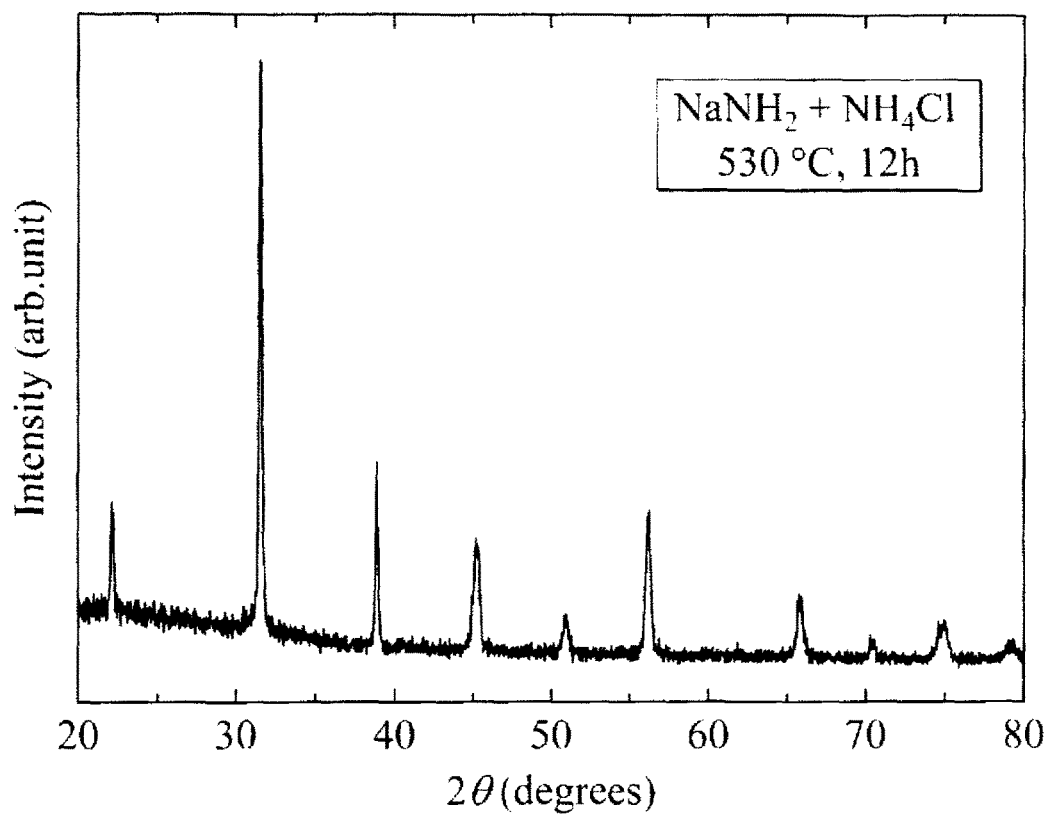

[Fig. 6]
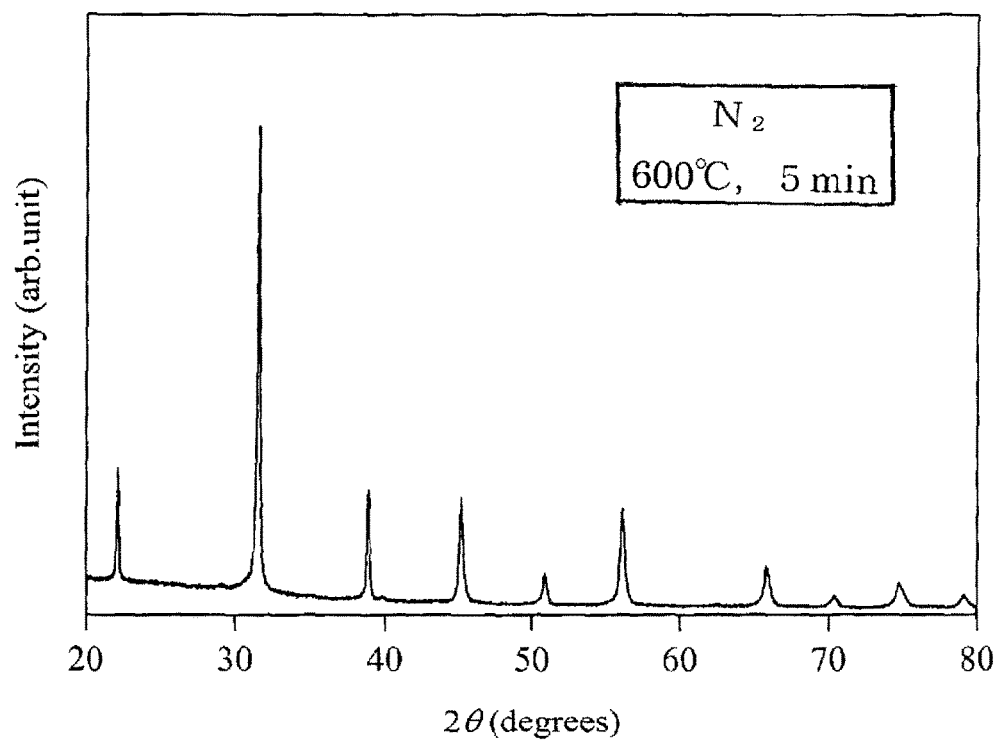

METHOD FOR PRODUCING PEROVSKITE METAL OXYNITRIDE

TECHNICAL FIELD

The present invention relates to a method for producing a perovskite metal oxynitride.

BACKGROUND ART

An attempt has been made to apply a metal oxynitride in which oxide ions ($O^{2-}$) and nitride ions ($N^{3-}$) coexist in the crystal with a photocatalyst, a pigment, a phosphor, a giant magnetostrictive material, a dielectric substance and the like (NPL 1).

A metal oxynitride is generally produced by heat-treating mixed powder of oxides as the raw materials in an ammonia flow at a high temperature of 800° C. or higher for several days. By the method, oxynitrides such as $ATaO_2N$ (A is Ca, Sr or Ba) and $PrTaON_2$ are obtained, and the oxynitrides are expected to be applied as photocatalysts (NPLs 2 and 3).

A perovskite metal oxynitride represented by $ABO_{3-n}N_n$ (A is a cation such as $Li^+$, $Ba^{2+}$ and $Sr^{2+}$, and B is a metal cation such as $Ti^{4+}$, $Zr^{4+}$ and $Sn^{4+}$) is used as a dielectric substance (PTL 1). PTL 1 describes a method for producing $BaTaO_2N$, $SrTaO_2N$, $BaNbO_2N$, $LaTaO_2N$, $LaTiO_2N$, $NdTaON_2$, $SmTaON_2$ or the like by nitriding a raw material oxide in an atmosphere of ammonia gas at 900 to 1000° C. using an electric furnace.

Moreover, a perovskite metal oxynitride represented by $AB(O, N)_3$ (A is Ca, Sr, Ba, La, Pr, Nd, Sm, Eu or Ce, and B is W, Mo, V, Nb, Ta or Ti) is used as an electric conductor (PTL 2). PTL 2 describes a method in which the metal oxynitride is produced by nitriding a composite oxide of metals A and B at 700 to 900° C. in an ammonia flow.

Furthermore, a method for producing an electron emission material containing an oxynitride perovskite containing a first component containing at least one of Ba, Sr and Ca and a second component containing at least one of Ta, Zr, Nb, Ti and Hf as metal element components, wherein the raw material composition is thermally processed in a nitrogen gas-containing atmosphere at 800 to 2000° C. with carbon placed near the raw material composition, is also known (PTL 3).

A piezoelectric material containing a tetragonal perovskite oxynitride containing Bi and a tetravalent element (PTL 4) and a piezoelectric material containing a tetragonal perovskite oxynitride containing Ti, Nb and Ta (PTL 5) are also known. These oxynitrides are produced by a method in which mixed powder of raw materials thermally processed at a high temperature or by a film-formation method such as sputtering.

These perovskite oxynitrides are generally obtained by a method in which a mixture of metal oxides is heated in an ammonia gas atmosphere to a high temperature and burned or a method in which a perovskite oxide is nitrided with high-temperature ammonia gas. An example in which barium titanate has been nitrided by the high-temperature ammonia gas nitriding method has been reported (NPL 4).

With respect to perovskite hydrides, cobalt oxide-hydride such as $LaSrCoO_3H_{0.7}$ or $Sr_3Co_2O_{4.33}H_{0.84}$ has been reported (NPLs 5 and 6). The present inventors have reported the synthesis of titanate oxyhydrides represented by the formula $ATi(O, H)_3$ (A is $Ca^{2+}$, $Sr^{2+}$ or $Ba^{2+}$) as a basis (NPLs 7 to 9 and PTL 6). The oxyhydrides are compounds in which hydrogen coexists as hydride ($H^-$) with oxide ions ($O^{2-}$) and are prepared by reducing a precursor $ATiO_3$ with a metal hydride such as $CaH_2$, LiH or NaH topochemically. The oxyhydrides are characterized by having hydride ion/electron mixed conductivity and hydrogen absorption/desorption properties.

CITATION LIST

Patent Literature

PTL 1: JP-A-61-122108
PTL 2: JP-A-63-252920
PTL 3: U.S. Pat. No. 3,078,287
PTL 4: JP-A-2010-143788
PTL 5: JP-A-2013-128073
PTL 6: WO2013/008705 A1

Non Patent Literature

NPL 1: Fuertes, S. (2012). "Chemistry and application of oxynitrideperovskites." J. Mater. Chem. 22, 3293-3299, (2012)
NPL 2: A. Hellwig et al., "Formation of barium-tantalum oxynitrides" J. Mater. Sci. 29, 4686-4693 (1994)
NPL 3: S. Balaz et al. "Electronic Structure of Tantalum OxynitridePerovskite Photocatalysts" Chemistry of Materials 25(16), pp 3337-3343(2013)
NPL 4: Brauniger, T., Muller, T., Pampel, A., and Abicht, "Study of Oxygen-Nitrogen Replacement in BaTiO3 by 14N Solid-State Nuclear Magnetic Resonance." Chem. Mater. 17, 4114-4117, H. P. (2005)
NPL 5: M. A. Hayward et al., "The Hydride Anion in an Extended Transition Metal Oxide Array; LaSrCoO3H0.7" Science, 295, 1882-1884(2002)
NPL 6: R. M. Helps et al., "Sr3Co2O4.33H0.84; An Extended Transition Metal Oxide-Hydride" Inorganic Chemistry, 49, 11062-11068(2010)
NPL 7: Y. kobayashi et al., "An oxyhydride of BaTiO3 exhibiting hydride exchange and electronic conductivity" Nat. Mater., 11, 507-511(2012)
NPL 8: T. Sakaguchi et al., "Oxyhydrides of (Ca, Sr, Ba)TiO3 PerovskiteSolid Solutions" Inorg. Chem., 51(21), 11371-11376(2012)
NPL 9: Takeshi Yajima et al., "Perovskite Oxyhydride", Journal of the Crystallographic Society of Japan, Vol. 55, No. 4, pages 242-247 (2013)

SUMMARY OF INVENTION

Technical Problem

A perovskite metal oxynitride is generally produced by heating mixed powder of raw material metal oxides in an electric furnace in an ammonia flow at a high temperature of 800° C. or higher for several days. However, since this high-temperature ammonia gas nitriding method is a method in which reaction to cut the bond between the metal and oxygen and reaction of the metal and nitrogen are conducted, the method has the following problems: the method requires reaction at a high temperature for several days; the energy used is large; the cost is high; the electric furnace is easily damaged; and better care is necessary in handling. Moreover, when chemical reaction at a high temperature is used, only a thermodynamically stable phase is obtained, and control of the composition and the structure is difficult. In addition, nitriding reaction advances on the surface of the powder only, and a difference in the degree of nitriding is generated between the surface and the inside.

Solution to Problem

The inventors have succeeded in producing an oxynitride by subjecting barium titanate, which is a typical perovskite metal oxide, to a new method including an ion exchange process and thereby introducing nitride ions to the metal oxide by reaction at a low temperature of lower than 700° C. for one hour to several days. By this method, a larger amount of nitride ions can be introduced into the metal oxide as compared to a reported example in which barium titanate was nitrided using the conventional high-temperature ammonia gas nitriding method (NPL 4), and the nitride ion content can be controlled optionally.

To produce a nitride by the conventional method using ammonia gas, it was necessary to heat the raw materials at a high temperature of 700° C., which is the thermal decomposition temperature of ammonia, or higher, preferably 800° C. or higher, for a long time. However, the method including an ion exchange process at a low temperature of lower than 700° C., preferably 600° C. or lower (hereinafter sometimes referred to as "low-temperature ammonia treatment), which the inventors have found, has a lower environmental load and is safe, and the control of the composition and the crystal structure, which was difficult by high-temperature reaction, is also possible.

Specifically, the following findings were made. The perovskite metal oxide is not directly subjected to high-temperature ammonia gas treatment. However, the oxide ions of the metal oxide are partially eliminated by reductive oxygen elimination reaction using a metal hydride and are converted to oxyhydride in which hydrogen coexists as hydride ($H^-$) with oxide ions. Then, through an H/N exchange process of hydride (hereinafter sometimes referred to as "H") and nitrogen (hereinafter sometimes referred to as "N") by the low-temperature ammonia treatment, nitride ions can be introduced to the perovskite metal oxide.

The H/N exchange process is an ion exchange reaction, unlike the conventional reductive nitriding method based on a reduction reaction to cut the bond between the metal and oxygen and the nitriding reaction of the metal and nitrogen, and nitriding can be easily conducted at a low temperature. In the H/N exchange, H is not exchanged with N at a ratio of 1:1, but H can be partially or entirely exchanged for N.

That is, the invention relates to a method for producing a perovskite metal oxynitride, comprising: a hydrogenation step (A) of forming a perovskite oxyhydride in which an oxide ion ($O^{2-}$) and a hydride ion ($H^-$) coexist by reducing a perovskite oxide through a reductive oxygen elimination reaction using a metal hydride; and a nitriding step (B) of forming a perovskite oxynitride containing a nitride ion ($N^{3-}$) by heat-treating the perovskite oxyhydride in the presence of a nitrogen source substance at a temperature of 300° C. or higher and 600° C. or lower and exchanging the hydride ion ($H^-$) for a nitride ion ($N^{3-}$).

As the nitrogen source substance in the nitriding step (B), an ammonia gas flow can be used.

As the nitrogen source substance in the nitriding step (B), an ammonia gas-generating agent can be used.

As the nitrogen source substance in the nitriding step (B), a nitrogen gas flow can be used.

The perovskite oxide is represented by the formula $A_{n+1}B_nO_{3n+1}$ (in the formula, n is any one of 1, 2, 3 and ∞, A is at least one of Ca, Ba, Sr, Pb and Mg, and B is at least one of Co, W, Mo, V, Ta, Zr, Nb, Ti and Hf). The perovskite oxyhydride is represented by the formula $A_{n+1}B_n(O_{1-x}H_x)_{3n+1}$ (in the formula, A and B are the same as those of the starting substance, H is a hydride ion ($H^-$) which has substituted an oxide ion, $0.01 \leq x \leq 0.2$, and n is any one of 1, 2, 3 and ∞).

The forms of the perovskite oxide, the perovskite oxyhydride and the perovskite metal oxynitride are preferably powder or a thin film.

Advantageous Effects of Invention

In the invention, an oxynitride can be produced at a lower temperature in a shorter time than in the conventional nitriding method, and the introduction of a larger amount of nitride ions and the control of the nitride ion content are possible. A large amount of nitride ions can be introduced by using the method of the invention for a perovskite metal oxide, which was difficult to nitride by the conventional high-temperature nitriding method.

BRIEF DESCRIPTION OF DRAWINGS

FIG. 1 The powder X-ray diffraction patterns of the nitride ion-containing barium titanates obtained using an ammonia gas flow method as the low-temperature ammonia treatment in Example 1. The temperature in the figure is the reaction temperature during the ammonia gas treatment.

FIG. 3 The upper figure is a graph obtained by plotting the lattice constant (a-axis and c-axis) against the nitrogen content y of the $BaTi(O_{3-z}H_xN_y)$ (here, z≥x+y, and z-x-y indicates the amount of oxygen defects) obtained in Example 1. The lower figure is a graph showing the relation between the hydrogen content (x) and the nitrogen content (y) of the same samples.

FIG. 4 A graph showing the results of the XPS measurement of the single crystal thin film after the nitriding treatment in Example 2.

FIG. 5 The powder X-ray diffraction pattern of the nitride ion-containing barium titanate obtained in Example 3.

FIG. 6 The powder X-ray diffraction pattern of the nitride ion-containing barium titanate obtained in Example 4.

DESCRIPTION OF EMBODIMENTS

Preparation of Oxyhydride

Figure 2A:
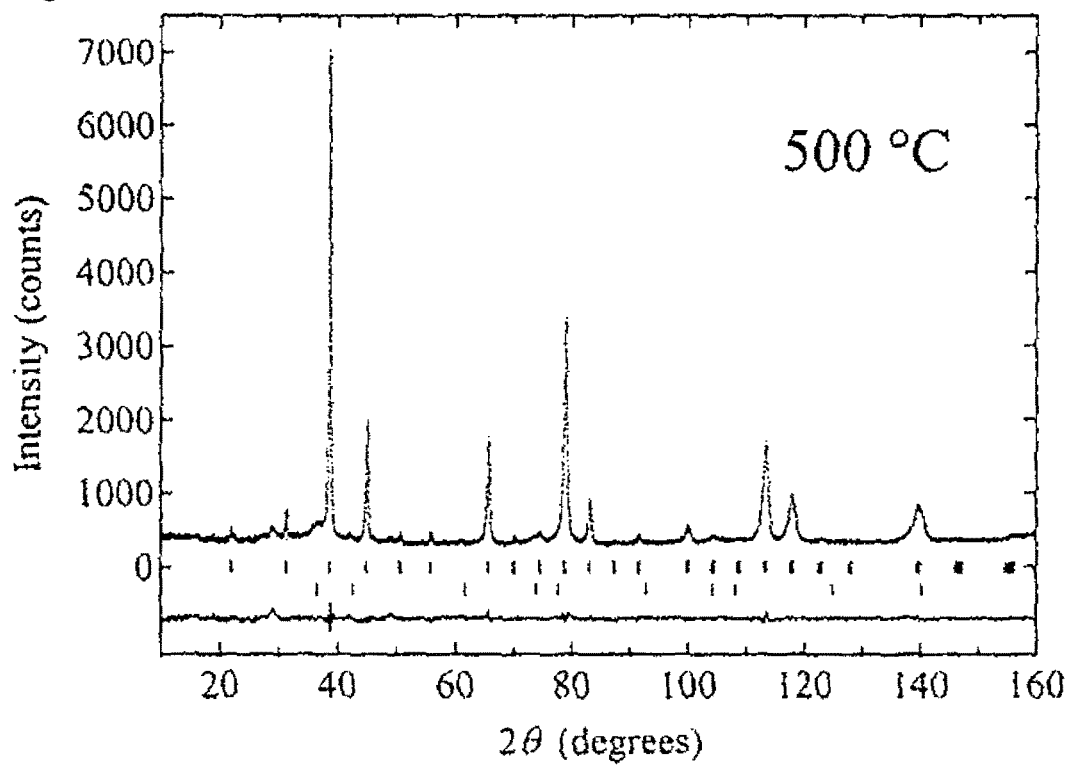
FIG. 2 A graph showing the results of the Rietveld structure analysis of the neutron diffraction pattern of the nitride ion-containing barium titanate ($NH_3$ flow 500° C.) obtained in Example 1 (FIG. 2A) and a schematic view of the crystal structure obtained by Rietveld structure analysis (FIG. 2B).

A perovskite structure is one of the crystal structures of compounds represented by the chemical formula $ABX_3$, and a perovskite metal oxide is represented by the chemical formula $ABO_3$. The kind of the starting substance perovskite metal oxide is not limited to particular substances, but typical examples thereof are compounds represented by the formula $ABO_3$, $A_2BO_4$, $A_3B_2O_7$ or $A_4B_3O_{10}$. The oxides are together represented by the following general formula.

$$A_{n+1}B_nO_{3n+1} \qquad \text{(Formula I)}$$

(in the formula, n is any one of 1, 2, 3 and ∞)

In the case of n=1, the formula is $A_2BO_4$, and in the case of n=2, the formula is $A_3B_2O_7$. In the case of n=3, the formula is $A_4B_3O_{10}$, and in the case of n=∞, the formula is $ABO_3$. In this regard, at least one element component of A, B and O may include up to 20 at. % of defects.

Although A in the general formula above is typically at least one of Ca, Ba, Sr, Pb and Mg, A is not limited to these divalent cations and may be a solid solution containing a cation having a different valence, such as La and Na, or a defect. Also, B in the general formula above is at least one of Co, W, Mo, V, Ta, Zr, Nb, Ti and Hf.

The forms of the starting substance perovskite metal oxide, the perovskite oxyhydride obtained and the perovskite metal oxynitride obtained are preferably powder or a thin film.

A metal hydride such as $CaH_2$, $LiH$, $BaH_2$, $SrH_2$ or $MgH_2$ is used to extract some of the oxide ions contained in the starting substance and to substitute the oxide ions with hydride ions ($H^-$). Such reaction is called as "reductive oxygen elimination reaction". It is believed that the oxide ions can be substituted with hydride ions because $CaH_2$, $LiH$, $BaH_2$, $SrH_2$ or $MgH_2$ exerts potent reducing power also at a low temperature of 600° C. or lower and has not only the capability of extracting oxygen from the oxide but also the capability of supplying hydride ions. Also, because the substitution reaction occurs at a relatively low temperature, deoxidation reaction and insertion reaction of a large amount of hydride ions can be topochemically achieved at the same time, without breaking the structural skeleton of the starting substance, and thus the production is easy.

The perovskite oxide-hydride obtained by the above method is a substance in which up to about 20 at. % of oxygen in the oxygen sites has been substituted with hydrogen. Because a part of or all of the hydride ions can be exchanged for nitride ions, the amount of oxygen substituted may be 1 at. % or more, and 5 at. % or more, further preferably 10 at. % or more can be substituted to exchange for a large amount of nitride ions.

That is, the perovskite oxide-hydride obtained by the above method can be represented by the following basic formula II.

$$A_{n+1}B_n(O_{1-x}H_x)_{3n+1} \qquad \text{(Formula II)}$$

(in the formula, A and B are the same as those of the starting substance, H is a hydride ion ($H^-$) which has substituted an oxide ion, $0.01 \leq x \leq 0.2$, and n is any one of 1, 2, 3 and ∞.)

In this regard, at least one element component of A, B and O may include up to 20 at. % of defects.

The hydrogen subjected to the substitution randomly (statistically) occupies oxygen sites. However, by controlling any of the factors determining the degree of hydridization, a gradient can be provided to the hydrogen concentration distribution from the surface of the powder or the thin film of the perovskite oxide-hydride obtained to its center.

Ion Exchange Process

The exchange reaction of the hydride ions ($H^-$) contained in the metal oxyhydride $A_{n+1}B_n(O_{1-x}H_x)_{3n+1}$ obtained for nitride ions ($N^{3-}$) can be conducted by a heat treatment method using any of the following nitrogen source substances. (1) An ammonia gas flow. (2) An ammonia gas-generating agent, such as urea, which generates ammonia by thermal decomposition, or mixed powder of sodium amide ($NaNH_2$) powder and ammonium chloride ($NH_4Cl$) powder, which generates ammonia by heat reaction. (3) A nitrogen gas flow.

Many reports on the synthesis of a nitride or an oxynitride using thermal decomposition of ammonia gas have been published, but reaction at a high temperature is required. In the invention, however, in the method of (1) above, powder or a thin film of the metal oxyhydride is exposed to an ammonia gas flow and heat-treated at 300° C. or higher and 600° C. or lower for a short time (generally about three hours). Thus, the ammonia gas is thermally decomposed into H and N, and a part of or all of the hydride ions in the oxyhydride are exchanged for nitride ions.

The exchange reaction by heat treatment at such a low temperature is based on the phenomenon where hydride ions are weakly bound to B metal ions in the formula II in the metal oxyhydride and easily diffuse in the crystal. As the temperature of the heat treatment with ammonia gas becomes higher, the nitriding reaction of the metal oxyhydride advances faster. Also, the degree of exchange can be controlled also by extending the reaction period. That is, by adjusting the heat treatment temperature and the period, the amount of the nitride ions to be introduced to the metal oxyhydride can be controlled at will.

In the method of (2) above, the ammonia gas-generating agent, such as $NaNH_2$ and $NH_4Cl$, causes the following chemical reaction when heated (200° C. or higher), generates ammonia gas and generates sodium chloride (NaCl).

$$NaNH_2 + NH_4Cl \rightarrow 2NH_3(gas) + NaCl(solid)$$

Accordingly, when powder or a thin film of the metal oxyhydride is mixed with $NaNH_2$ powder and $NH_4Cl$ powder and the mixture is heat-treated, ion exchange reaction of H for N through decomposition of ammonia gas can be caused as in the method of (1).

With respect to the atmosphere containing the ammonia gas-generating agent, such as mixed powder of $NaNH_2$ and $NH_4Cl$, a mixed powder of $NaNH_2$ and $NH_4Cl$ and powder or a thin film of the metal oxyhydride are preferably simultaneously vacuum-sealed in a heat and chemical resistant container such as a container of quartz glass. It is not necessary to bring $NaNH_2$ and $NH_4Cl$ into contact with the metal oxyhydride. A low temperature of 300° C. or higher and 600° C. or lower is sufficient as the heat treatment temperature as in the method of (1), and the reaction period required is 12 hours to 24 hours. The atmosphere in the container may be an inert atmosphere such as argon or nitrogen gas.

In the method of (3) above, nitrogen gas is used as the nitrogen source substance for the ion exchange reaction of H for N. By exposing powder or a thin film of the metal oxyhydride to a nitrogen gas flow and heat-treating the powder or the thin film at a low temperature of 300° C. or higher and 600° C. or lower for several hours, hydride ions are exchanged with nitride ions.

A titanium-containing perovskite oxide which is represented by the above formula (I) in which B is Ti exhibits excellent electrical properties such as dielectric property, piezoelectric property and pyroelectric properties and thus has been studied for a long time in view of the application to various electronic materials. In addition to the properties, because titanium is a low cost material and has high biocompatibility, titanium is attractive as a constituent element of an oxynitride.

The method for producing a barium titanate oxynitride using, as the starting material, barium titanate ($BaTiO_3$), which is a typical example of the perovskite metal oxide represented by the formula $ABO_3$, is explained specifically below using Examples. One skilled in the art would easily understand that the low-temperature ammonia treatment method of the invention can be applied in principle not only to barium titanate oxynitrides but also to all the metal oxynitrides with known compositions regardless of the difference in the difficulty of nitriding degree and that the creation of a novel metal oxynitride is also possible by applying the method of the invention.

Example 1

Hydrogenation Step (A)

Barium titanate ($BaTiO_3$) powder having a particle size of about 100 nm was dried at 100° C. in a vacuum atmosphere and mixed with three equivalents of calcium hydride ($CaH_2$) powder in a glove box, and the mixture was pressed into pellets using a hand press. The pellets were put into a quartz tube having an internal volume of about 15 cm$^3$, vacuum-sealed and then hydrogenated by heat-treating the pellets at 580° C. for 150 hours. The sample after the heat treatment was treated with a 0.1 M $NH_4Cl$ methanol solution to remove unreacted $CaH_2$ and by-product CaO that were attached to the product.

The powder obtained was dark blue close to black. It was found by powder X-ray diffraction and powder neutron diffraction that the perovskite crystal structure was maintained. It was confirmed by Rietveld analysis and thermal desorption spectroscopy (TDS) that the composition was $BaTi(O_{0.8}H_{0.2})_3$.

Nitriding Step (B)

The $BaTi(O_{0.8}H_{0.2})_3$ powder was dried at 100° C. in a vacuum atmosphere and then pressed into pellets using a hand press. The pellets were put into a quartz tube having an internal diameter of about 3 cm and heat-treated in an ammonia gas flow (300 mL per minute) at 375° C., 400° C., 425° C. or 500° C. for three hours, and nitriding reaction was thus conducted at atmospheric pressure.

The hydrogen amounts of the samples obtained were measured by thermal desorption spectroscopy (TDS), and the nitrogen amounts thereof were measured by trace element analysis, thereby determining the compositions. As a result, it was confirmed that the samples had the compositions containing hydride ions ($H^-$) and nitride ions ($N^{3-}$) as shown in Table 1 ($\square$ indicates a defect which was not occupied by any of O, H and N).

TABLE 1

| Sample No. | Heat Treatment Temperature (° C.) | Composition |
| --- | --- | --- |
| a | 375 | $BaTi(O_{0.8}H_{0.13}N_{0.03}\square_{0.04})_3$ |
| b | 400 | $BaTi(O_{0.8}H_{0.06}N_{0.08}\square_{0.06})_3$ |
| c | 425 | $BaTi(O_{0.8}H_{0.01}N_{0.12}\square_{0.07})_3$ |
| d | 500 | $BaTi(O_{0.8}N_{0.13}\square_{0.07})_3$ |

A sample after the ammonia gas treatment is blue when the nitrogen amount is low, and the color becomes green as the nitrogen amount increases. It was found by powder X-ray diffraction and powder neutron diffraction that the samples obtained maintained the perovskite crystal structure.

Figure 2B:
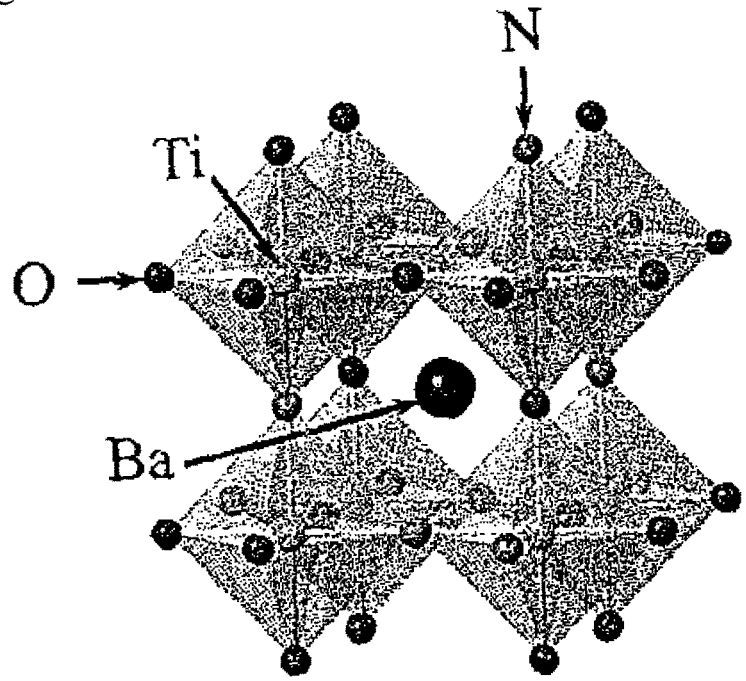

FIG. 1 shows the powder X-ray diffraction patterns of the nitride ion-containing barium titanates obtained at the respective heat treatment temperatures. FIG. 2 shows the crystal structure determined by Rietveld analysis of the powder neutron diffraction pattern of the sample No. d, which was heat-treated at 500° C. It was confirmed that in the sample after the heat treatment, all the hydride ions introduced were substituted with nitride ions. In this regard, it can be seen that N has exchanged at a lower ratio than H because $BaTiO_{2.4}N_{0.39}$ was generated from $BaTiO_{2.4}H_{0.6}$.

The upper figure of FIG. 3 shows the lattice constant (a-axis and c-axis) plotted against the nitrogen content (y) of the nitride ion-containing barium titanates obtained at the respective heat treatment temperatures. In FIG. 3, because the compositions are represented by $BaTi(O_{3-z}H_xN_y)$, the values of x and y are three times as much as the values of the compositions shown in Table 1.

The samples before nitriding had an ideal cubic perovskite structure, but the samples after nitriding changed into a distorted tetragonal structure due to the introduction of nitride ions. This is similar to the phenomenon where the ferroelectric substance $BaTiO_3$ has a tetragonal structure at room temperature.

The lower figure of FIG. 3 shows the relation between the hydrogen content (x) and the nitrogen content (y) of the same samples. It can be seen that a larger amount of nitride ions can be introduced as the heat treatment temperature becomes higher and that the nitride ion content can be controlled with the temperature. In addition, it can be seen that almost all the hydride ions can be exchanged for nitride ions also at a low temperature.

Example 2

A $BaTiO_3$ single crystal thin film having an area of 1 cm×1 cm and a thickness of 100 nm was deposited as a sample on an LSAT [$(La_{0.3}Sr_{0.7})(Al_{0.65}Ta_{0.35})O_3$] substrate by the PLD method as described below. $BaTiO_3$ pellets were used as the target. The temperature of the substrate was 700° C., and the oxygen pressure during the deposition was 0.05 Pa. A KrF excimer laser pulse (wavelength=248 nm) was employed as an excitation light source.

Hydrogenation Step (A)

In a glove box filled with nitrogen, the obtained single crystal thin film and 0.2 g of $CaH_2$ powder were vacuum-sealed in a Pyrex (registered trademark) tube and heat-treated at a temperature of 530° C. for one day to conduct the hydrogenation reaction. Unreacted $CaH_2$ and by-product CaO that were attached to the product were removed by ultrasonic cleaning with acetone.

Nitriding Step (B)

The precursor single crystal thin film thus obtained was heat-treated in an ammonia gas flow as in Example 1 to conduct nitriding reaction, and a $BaTi(O, N, \square)_3$ single crystal thin film was thus obtained.

It was found by X-ray diffraction that the sample obtained was a single crystal thin film which maintained the perovskite crystal structure. The electrical resistance of the single crystal thin film after hydrogenation treatment exhibits metallic temperature dependence. However, as the ion exchange reaction of hydrogen for nitrogen advances, the electrical resistance increases gradually, and a completely nitrided thin film is an insulator.

FIG. 4 shows the results of the XPS measurement of the single crystal thin film after the nitriding treatment with the surface partially removed out by Xe sputtering. Because there was a peak derived from nitrogen at the binding energy of 400 eV, the presence of a sufficiently large amount of nitrogen was confirmed in the thin film. Reflecting the non-centrosymmetry, which is a necessary condition of a ferroelectric substance, the thin film exhibits second harmonic generation (SHG).

Example 3

Hydrogenation Step (A)

BaTi($O_{0.8}H_{0.2}$)$_3$ powder was prepared by a similar procedure to that of Example 1.

Nitriding Step (B)

The obtained BaTi($O_{0.8}H_{0.2}$)$_3$ powder (about 0.1 g) was dried at 100° C. in a vacuum atmosphere and then pressed into pellets using a hand press. A mixture of equivalent moles of $NaNH_2$ and $NH_4Cl$ powder (about 0.06 g) as an ammonia-generating agent was pressed into pellets using a hand press. The pellets were put into a quartz tube having an internal volume of about 15 $cm^3$ and vacuum-sealed, and then heat treatment was conducted at 530° C. for 12 hours.

The sample after the heat treatment is green with the ion exchange. FIG. 5 shows the powder X-ray diffraction pattern of the sample. The sample obtained maintained the perovskite crystal structure and changed from a cubic structure (a=b=c=4.01 Å) before the reaction to a tetragonal structure (a=b=4.00 Å, c=4.02 Å) due to the introduction of nitride ions.

Example 4

Hydrogenation Step (A)

BaTi($O_{0.8}H_{0.2}$)$_3$ powder was prepared by a similar procedure to that of Example 1.

Nitriding Step (B)

The obtained BaTi($O_{0.8}H_{0.2}$)$_3$ powder (about 0.1 g) was dehydrated at 100° C. in a vacuum atmosphere and then pressed into pellets using a hand press. The pellets were put into a quartz tube having an internal diameter of about 3 cm, heated to 600° C. at 5° C. per minute in a nitrogen gas flow (110 mL per minute), kept at 600° C. for five minutes and then cooled to room temperature at 10° C. per minute to conduct heat treatment, and nitriding reaction was thus conducted.

The sample after the heat treatment is green with the ion exchange. FIG. 6 shows the powder X-ray diffraction pattern of the sample. The sample obtained maintained the perovskite crystal structure and changed from a cubic structure (a=b=c=4.01 Å) before the reaction to a tetragonal structure (a=4.00 Å, c=4.02 Å) due to the introduction of nitride ions.

INDUSTRIAL APPLICABILITY

The method for producing a perovskite metal oxynitride of the invention is a process at a lower temperature in a shorter time than those of the conventional methods. Thus, the method has a lower environmental load and is a safe, and advantages such as a decrease in the production cost are also expected. Moreover, the method is means which allows the development of a novel oxynitride which could not be produced by the conventional methods, and it is believed that the method can contribute to the further development in the fields of electronic materials, electrical materials, photocatalysts, pigments and fluorescent materials.

The invention claimed is:

1. A method for producing a perovskite metal oxynitride, comprising:
   a hydrogenation step (A) of forming a perovskite oxyhydride in which an oxide ion ($O^{2-}$) and a hydride ion ($H^-$) coexist, by reducing a perovskite oxide through a reductive oxygen elimination reaction using a metal hydride; and
   a nitriding step (B) of forming a perovskite oxynitride containing a nitride ion ($N^{3-}$) by heat-treating the perovskite oxyhydride in the presence of a nitrogen source substance at a temperature of 300° C. or higher and 600° C. or lower and exchanging the hydride ion ($H^-$) for a nitride ion ($N^{3-}$).

2. The method for producing a perovskite metal oxynitride according to claim 1 wherein the nitrogen source substance in the nitriding step (B) is an ammonia gas flow.

3. The method for producing a perovskite metal oxynitride according to claim 1 wherein the nitrogen source substance in the nitriding step (B) is an ammonia gas-generating agent.

4. The method for producing a perovskite metal oxynitride according to claim 1 wherein the nitrogen source substance in the nitriding step (B) is a nitrogen gas flow.

5. The method for producing a perovskite metal oxynitride according to claim 1 wherein the perovskite oxide is a compound represented by the formula $A_{n+1}B_nO_{3n+1}$ (in the formula, n is any one of 1, 2, 3 and ∞, A is at least one of Ca, Ba, Sr, Pb and Mg, and B is at least one of Co, W, Mo, V, Ta, Zr, Nb, Ti and Hf), and the perovskite oxyhydride is a compound represented by the formula $A_{n+1}B_n(O_{1-x}H_x)_{3n+1}$ (in the formula, A and B are the same as those of the starting substance, H is a hydride ion ($H^-$) which has substituted an oxide ion, 0.01≤x≤0.2, and n is any one of 1, 2, 3 and ∞).

6. The method for producing a perovskite metal oxynitride according to claim 1 wherein the forms of the perovskite oxide, the perovskite oxyhydride and the perovskite metal oxynitride are powder or a thin film.

* * * * *